US008924897B2

(12) United States Patent
Oishi et al.

(10) Patent No.: US 8,924,897 B2
(45) Date of Patent: Dec. 30, 2014

(54) MASK PATTERN DESIGN METHOD AND SEMICONDUCTOR MANUFACTURING METHOD AND SEMICONDUCTOR DESIGN PROGRAM

(75) Inventors: Hidetoshi Oishi, Kanagawa (JP); Mikio Oka, Kanagawa (JP)

(73) Assignee: Sony Corporation, Tokyo (JP)

( * ) Notice: Subject to any disclaimer, the term of this patent is extended or adjusted under 35 U.S.C. 154(b) by 873 days.

(21) Appl. No.: 12/099,928

(22) Filed: Apr. 9, 2008

(65) Prior Publication Data

US 2008/0256504 A1 Oct. 16, 2008

(30) Foreign Application Priority Data

Apr. 12, 2007 (JP) ................................ 2007-104424

(51) Int. Cl.
  G06F 17/50 (2006.01)
  G03F 1/36 (2012.01)
  G03F 7/20 (2006.01)
  G03F 1/00 (2012.01)

(52) U.S. Cl.
  CPC ...... *G03F 1/144* (2013.01); *G03F 1/36* (2013.01); *G03F 7/705* (2013.01)
  USPC .......................................................... 716/56

(58) Field of Classification Search
  CPC ...... G03F 7/705; G03F 17/5081; H01L 22/20
  USPC .................................................... 716/50–56
  See application file for complete search history.

(56) References Cited

U.S. PATENT DOCUMENTS

| 6,496,958 B1 * | 12/2002 | Ott et al. ........................ 700/110 |
| 6,948,141 B1 * | 9/2005 | Satya et al. ...................... 716/52 |
| 2004/0107410 A1 * | 6/2004 | Misaka et al. ..................... 716/8 |

(Continued)

FOREIGN PATENT DOCUMENTS

| JP | 1992 104054 | 4/1992 |
| JP | 2002 131882 | 5/2002 |
| JP | 2002 328459 | 11/2002 |

(Continued)

OTHER PUBLICATIONS

Charrier et al., "Yield modeling and enhancement for optical lithography", Proceedings of SPIE, vol. 2440, pp. 435-447 (May 1995).*

(Continued)

*Primary Examiner* — Vuthe Siek
*Assistant Examiner* — Aric Lin
(74) *Attorney, Agent, or Firm* — Dentons US LLP

(57) ABSTRACT

A mask pattern design method includes: dividing design layout data for a pattern into multiple regions and extracting any region wherein transfer dimensions obtained from a transfer simulation of the pattern from the plurality of regions exceeds a predetermined allowance range; setting a process window of which multiple transfer conditions of the pattern data from the region extracted by the process are each changed, and computing transfer dimensions obtained from a transfer simulation with each transfer condition with the process window; and extracting the transfer conditions wherein the transfer dimension obtained from the transfer simulation with each transfer condition with the process window exceeds a predetermined allowance range, and computing yield from an occurrence probability regarding the transfer condition.

5 Claims, 10 Drawing Sheets

(56) References Cited

U.S. PATENT DOCUMENTS

| | | | |
|---|---|---|---|
| 2005/0153217 A1* | 7/2005 | Izuha et al. | 430/5 |
| 2006/0236271 A1* | 10/2006 | Zach | 716/1 |
| 2007/0050749 A1* | 3/2007 | Ye et al. | 716/20 |
| 2007/0157153 A1* | 7/2007 | Croffie et al. | 716/21 |

FOREIGN PATENT DOCUMENTS

| | | |
|---|---|---|
| JP | 2006-154404 | 6/2006 |
| JP | 2006-253409 | 9/2006 |
| JP | 2007 012687 | 1/2007 |

OTHER PUBLICATIONS

C.H. Stapper; Modeling of Integrated Circuit Sensitivities; IBM J. Res. Develop.; vol. 27, No. 6; Nov. 1983.

Lars Liebmann et al.; Reducing DfM to Practice: the Lithography Manufacturability Assessor; Proc. of SPIE; vol. 6156, 2006.

Japanese Office Action dated Feb. 20, 2009, issued in connection with counterpart Japanese Patent Application No. 2007-104424.

* cited by examiner

MASK PATTERN DESIGN METHOD AND SEMICONDUCTOR MANUFACTURING METHOD AND SEMICONDUCTOR DESIGN PROGRAM

CROSS REFERENCES TO RELATED APPLICATIONS

The present invention contains subject matter related to Japanese Patent Application JP 2007-104424 filed in the Japanese Patent Office on Apr. 12, 2007, the entire contents of which are incorporated herein by reference.

BACKGROUND OF THE INVENTION

1. Field of the Invention

The present invention relates to a mask pattern design method and semiconductor manufacturing method, and semiconductor design program, to perform transfer simulation employing design layout data of a mask pattern, and compute yield with verification of the pattern data.

2. Description of the Related Art

In related art, methods to increase layout robustness have been proposed such as a layout optimizer with consideration for manufacturability (DFM: Design For Manufacturing), whereby patterns likely to fail at time of manufacturing during various layout stages, such as standard cells or product chips, are identified, and are corrected to become patterns which can avoid defect, or layouts likely to fail are avoided at time of OPC (Optical Proximity Correction).

Also, feedback is provided to the manufacturing side regarding a method to specify a process to take into particular consideration during process improvements from the defect rate of each layer predicted from the layout, or defects predicted in the layout stage, such as a set in target yield of the product towards the target yield for each process according to the ability as to the defects of the layout.

Such defects occurring in the manufacturing process of a semiconductor integrated circuit include systematic defects which result from the manufacturing process, and random defects which occur spontaneously.

With the mask pattern correcting method in Japanese Unexamined Patent Application Publication No. 2006-154404, a pattern having locations of optical isolation of a semiconductor integrated circuit layout is extracted, and by providing an extension portion extending from the end portion of an adjacent pattern or from the end edge portion, occurrences of an optically isolated pattern can be minimized.

As a result, the process window of the lithography process with the semiconductor integrated circuit manufacturing can be expanded. That is to say, a process margin such as a focus margin or the like during the lithography process can be expanded. Accordingly, in particular, a situation can be avoided wherein during focus fluctuation, necessary contrast cannot be obtained, whereby desired line width cannot be obtained, the line width of the wiring is decreased, resulting in a systematic defect of an open error (so-called Hot Spot) from a broken wire or connection defect.

In Japanese Unexamined Patent Application Publication No. 2006-253409, a proposal has been made to analyze systematic defects resulting from an alignment shift between the wiring and the via occurring in the manufacturing process of the semiconductor integrated circuit from the layout, wherein layout modification is made to double on a via likely to have an error.

In Japanese Unexamined Patent Application Publication No. 2003-41960, the transfer shape on a wafer is computed with multiple process conditions, whereby in the case that the transfer shape does not satisfy the specified dimension allowance values, this is determined to be a Hot Spot, a design layout index for avoiding a Hot Spot is created from the difference amount from the dimension allowance values, and layout modifications are performed.

On the other hand, with random defects, faults such as particles in the manufacturing process cause open wiring, shorted wires, and open holes. With a semiconductor integrated circuit layout, a method to predict random defects is proposed (C. H. Stapper, "Modeling of Integrated Circuit Defect Sensitivities", IBM J. Res. Develop. USA 1983, November Vol. 27, p. 549-557), such method being to compute yield by employing a critical area that fails when the defective distribution curve and particles falls.

A critical area indicates a ratio of fatal locations in a circuit layout which is opened or shorted out by particles or the like, with the various processes in the manufacturing process. Wire Spreading function during wiring of a chip layout or Via Doubling function to avoid single via defects are provided by a wiring tool, for reduction in random defects by reduction of critical areas.

These layout robustness improvement methods may have a trade-off relation wherein layout correction as to a specified defect cause can lead to another defect. For example, the Hot Spot of the wiring layer can be avoided by employing the method proposed in Japanese Unexamined Patent Application Publication No. 2006-154404, but the critical area of shorted wiring increases (see FIG. 9). Also, with the Via Doubling function, Hot Spots can increase, resulting from combinations of dense and isolated patterns (see FIG. 10).

Thus, by employing a layout robustness method, the above-mentioned trade-offs for yield improvement advantages can be quantitatively considered, and the layout robustness method with the maximum yield can be selected. Also, yield can be predicted for random defects with a method employing critical areas.

On the other hand, with systematic defects occurred in one layer or between multiple layers of a semiconductor integrated circuit resulting from process variability in the lithography process (open wiring, shorted wires, failed via connections, wiring-via shorts, intra-via shorts), process window analysis (the transfer shape on the wafer is predicted in the case that the process from the lithography simulation applying multiple process conditions within a manufacturing process variability allowance value (process window) is uneven is predicted, and whether or not the transfer shape thereof fulfils the dimension allowance values is confirmed) is performed employing lithography simulation (simulation to predict the finished shape on the wafer), whereby in the case that the transfer shape of the specified process parameter condition is not within the dimension allowance values, the occurrence probability of such process condition is decreased by the amount of yield, whereby computing with yield can be performed (Lars Liebmann, "Reducing DfM to Practice: the Lithography Manufacturability Assessor", Proc. of SPIE, vol. 6156, 2006). With the connection defects between the wiring and via resulting from an alignment shift, computations can be made with a method to express the alignment shift at the layout stage such as that described in Japanese Unexamined Patent Application Publication No. 2006-253409.

With providing defect information predicted at the layout stage to the manufacturing side as feedback, a method to specify a process to focus on process improvements from defect distribution by layer and random yield by layer computed from the critical areas, or setting the target yield of product into each process yield, and so forth are performed.

Also, if the systematic defects become quantifiable in addition to the random yield information feedback, the defects resulting from variability from the manufacturing processing predicted in the layout stage can be anticipated as feedback to the manufacturing side. For example, a layout with high via redundancy rate is a layout which is robust as to alignment shifting, enabling relaxed alignment specifications in a range not influencing the yield, and decrease in the rate of rework of wafers. Conversely, in the event that connection defects occur in the range of combined specifications, the device management specifications for an alignment wherein yield does not decline is defined, enabling feedback to the process control.

SUMMARY OF THE INVENTION

Now, in order to quantify the defects occurring in one layer or between multiple layers of the semiconductor integrated circuit resulting from processing variability in the lithography process with process window analysis, a lithography simulation having set multiple conditions (focus and exposure amount of an exposure device, alignment, variability of a finished mask, and so forth) must be calculated.

However, with a layout of a size exceeding $0.1\ cm^2$, the processing time required for lithography simulation is huge, and converging the calculations is impossible. Therefore, the trade-off relation with the layout robustness method cannot be quantified, and a layout for optimal yield cannot be evaluated. Also, there is the problem that the systematic yield information resulting from process variability calculated from the layout cannot be provided to the manufacturing process side as feedback.

A mask pattern design method according to an embodiment of the present invention includes the steps of: dividing design layout data for a pattern into multiple regions and extracting any region wherein transfer dimensions obtained from a transfer simulation of the pattern from the multiple regions exceeds a predetermined allowance range; setting a process window of which multiple transfer conditions of the pattern data from the region extracted by the process are each changed, and computing transfer dimensions obtained from a transfer simulation with each transfer condition with the process window; and extracting the transfer conditions wherein the transfer dimension obtained from the transfer simulation with each transfer condition with the process window exceeds a predetermined allowance range, and computing yield from an occurrence probability regarding the transfer condition.

Also, a semiconductor manufacturing method according to an embodiment of the present invention includes the steps of: dividing design layout data for a pattern into multiple regions and extracting any region wherein transfer dimensions obtained from a transfer simulation of the pattern from the multiple regions exceeds a predetermined allowance range; setting a processing window wherein each of multiple transfer conditions regarding pattern data of the extracted regions are applied, and computing transfer dimensions obtained from a transfer simulation with each transfer condition with the process window; extracting the transfer conditions wherein the transfer dimension obtained from the transfer simulation with each transfer condition with the process window exceeds a predetermined allowance range, and computing yield from an occurrence probability regarding the transfer condition; and in the case that the computed yield is within a predetermined range, performing pattern transfer with the design layout data, whereby a semiconductor device is manufactured.

Also, a semiconductor design program to be executed with a computer, according to an embodiment of the present invention, includes the steps of: dividing design layout data for a pattern into multiple regions and extracting any region wherein transfer dimensions obtained from a transfer simulation of the pattern from the multiple regions exceeds a predetermined allowance range; setting a processing window wherein each of multiple transfer conditions regarding pattern data of the extracted regions are applied, and computing transfer dimensions obtained from a transfer simulation with each transfer condition with the process window; and extracting the transfer conditions wherein the transfer dimension obtained from the transfer simulation with each transfer condition with the process window exceeds a predetermined allowance range, and computing yield from an occurrence probability regarding the transfer condition.

According to embodiments of the present invention, regions wherein the transfer dimensions obtained by pattern transfer simulation from multiple regions with the pattern design layout data is divided exceeds a predetermined allowance range are extracted, and the transfer simulation is performed with the various transfer conditions from the process window regarding such regions. Therefore, detailed transfer simulation is performed regarding the regions extracted from the design layout data, whereby manufacturing yield can be calculated in a short time period.

According to embodiments of the present invention, defects occurring in one layer or between multiple layers of a semiconductor integrated circuit resulting from process variability in the lithography process are quantified with process window analysis, as to a layout of a size exceeding $0.1\ cm^2$, for example.

In particular, according to embodiments of the present invention, process window analysis is not performed on the entire layout, but extracts a pattern within the layout prone to various defects (Hot Spot), and performs process window analysis as to the periphery of the extracted pattern.

Further, by calculating the common process window for all extracted patterns (creating a consolidated map), a process window can be extracted which has even one pattern not within the dimension allowance values, and by adding the occurrence probabilities of this process window, the systematic yield decrease amount can be computed.

Thus, the area to be subjected to these processes can be greatly reduced over the entire layout, much more than process window analysis. Therefore, calculation time can be greatly reduced, and calculations for systematic yield resulting from process variability can be converged in a short time.

Accordingly, systematic yield can be quantified in a short time, and comparison with random yield can be made readily. Also, with a layout robustness method wherein random yield and systematic yield have a trade-off, the layout with the greatest yield can be accurately selected.

DESCRIPTION OF THE PREFERRED EMBODIMENTS

Embodiments according to the present invention will be described with reference to the diagrams. Note that with the present embodiment, an example of a method is given wherein, as to a layout of a certain size such as that exceeding 0.1 cm$^2$, a defect (Hot Spot) occurring in one layer or between multiple layers of a semiconductor integrated circuit resulting from process variability of the lithography process is quantified as yield with process window analysis.

Figure 1:
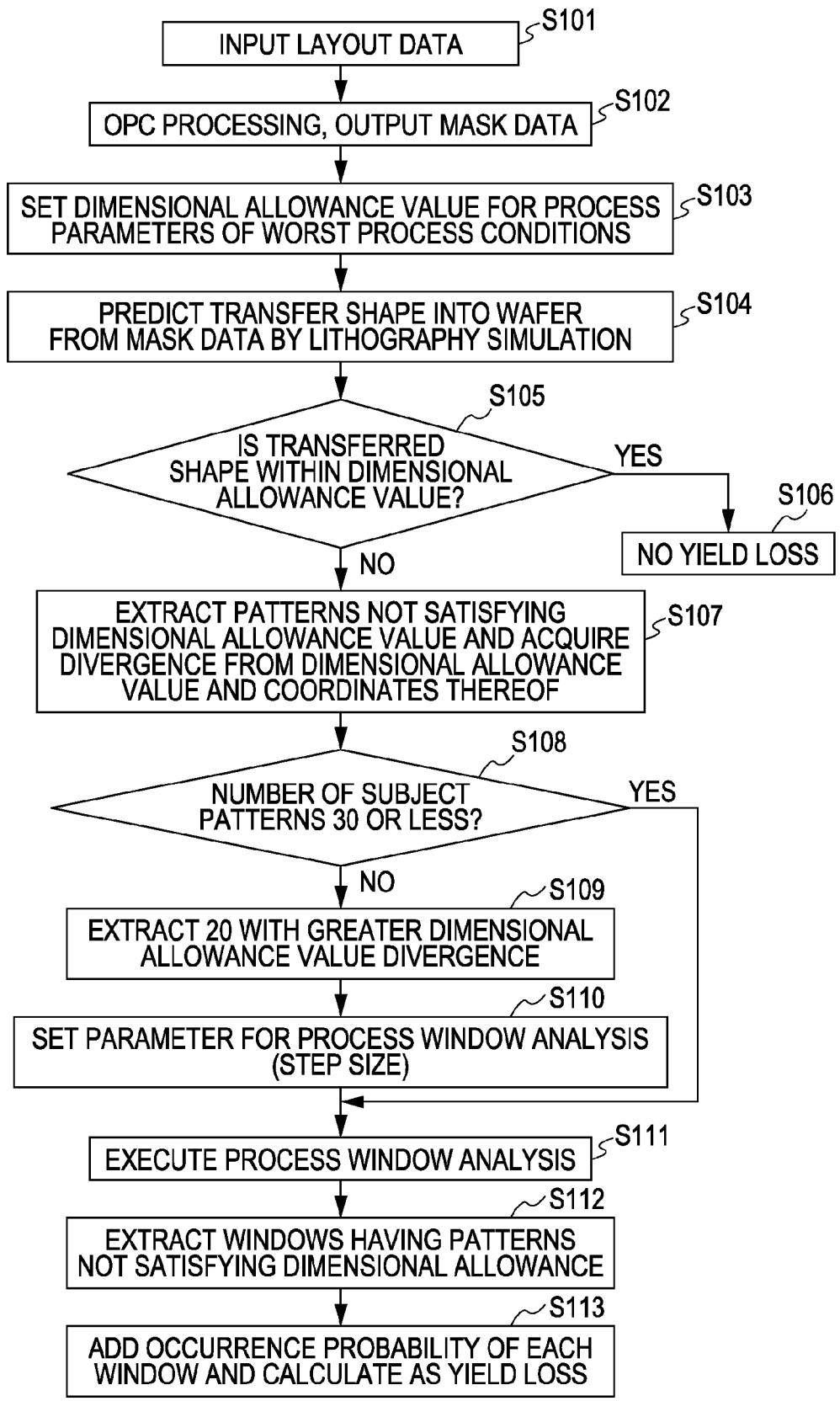
FIG. 1 is a flowchart describing a mask pattern design method according to an embodiment of the present invention.

FIG. 1 is a flowchart describing a mask pattern design method according to an embodiment of the present invention. First, processing to extract a pattern likely to become a Hot Spot in the layout which is characteristic of the present embodiment is performed beforehand.

That is to say, for example the design layout data of a mask pattern is obtained from a database (step S101), and OPC processing is performed as to the layout data whereby the mask pattern is created (step S102).

Next, the created mask pattern is divided into multiple regions, the data for each region is input in a lithography simulation, and the transfer shape on the wafer is predicted (steps S103 through S104). In this event, the dimension allowance values are set as to the transfer shape (step S103), and patterns not within the dimension allowance values are extracted and become regions subjected to process window analysis (subject patterns).

Note that the process parameters to set the lithography simulation set process corner conditions. A process corner condition here is a process parameter wherein a defect is most likely to occur within variability allowance values at time of manufacturing.

Also, a process parameter may be focus of an exposure device, exposure amount, aberration, mask shape difference resulting from a mask process, alignment shift, dimension variances resulting from an etching process, or the like.

As a result of the lithography simulation with a process corner condition for extracting a pattern, a pattern within the dimension allowance values is determined to be a pattern with no yield decrease within the process window (steps S105 through S106). Accordingly, even if the subjects of process window analysis is limited to patterns not within the dimension allowance values, yield computing results similar to the case of performing process window analysis as to the input layout are obtained.

With the various systematic defects, open wiring is expressed as transfer shape line width, wiring shorts/wiring-via shorts/intra-via shorts are expressed as intra-transfer shape space, and contact-via connection defects are expressed as a cover area of the contact-via and wiring layer, whereby dimension allowance values are set as to each thereof.

Note that as a result of lithography simulation with a process corner condition, in the case that a fairly large number (for example, 30 or more) of patterns are extracted, the difference values from the allowance dimensions are obtained (step S107), and a fixed number (e.g. 20 or so) are extracted starting with those in descending order of difference (steps S108 through S109).

Note that in the case there are similar shapes in the extracted patterns, only those with the most difference amounts from the allowance dimensions are retained, and the remainder are removed from being subjected. Also, if all of the patterns have transfer shapes within the dimension allowance values, these are assumed to have no yield decrease resulting from process variability of the lithography process, and the flow is ended.

Next, process window analysis is performed as to the subject patterns (steps S110 through S111). In order to accurately consider the optical influence of the periphery pattern, approximately 1 to 10 μm is assumed to be a simulation region with the pattern coordinates in the center thereof.

With the process window analysis, a process parameter is modified with multiple conditions and transfer shape predicted within the manufacturing process variability allowance values, and extracts conditions no within the dimension allowance values (step S112). As an example, a condition wherein the focus and exposure amount are modified with a fixed step size in the range of the manufacturing variability allowance values are shown in Table 1 (Table 1: focus allowance values±0.15 μm, step size 0.05 μm, exposure amount allowance values±3%, steps 1%, 7×7=49 conditions).

TABLE 1

| | Focus | Exposure amount |
|---|---|---|
| 1 | 0 | 0% |
| 2 | 0 | 1% |
| 3 | 0 | −1% |
| 4 | 0 | 2% |
| 5 | 0 | −2% |
| 6 | 0 | 3% |
| 7 | 0 | −3% |
| 8 | 0.05 | 0% |
| 9 | 0.05 | 1% |
| 10 | 0.05 | −1% |
| 11 | 0.05 | 2% |
| 12 | 0.05 | −2% |
| 13 | 0.05 | 3% |
| 14 | 0.05 | −3% |
| 15 | −0.05 | 0% |
| 16 | −0.05 | 1% |
| 17 | −0.05 | −1% |
| 18 | −0.05 | 2% |
| 19 | −0.05 | −2% |
| 20 | −0.05 | 3% |
| 21 | −0.05 | −3% |
| 22 | 0.1 | 0% |
| 23 | 0.1 | 1% |
| 24 | 0.1 | −1% |
| 25 | 0.1 | 2% |
| 26 | 0.1 | −2% |
| 27 | 0.1 | 3% |
| 28 | 0.1 | −3% |
| 29 | −0.1 | 0% |
| 30 | −0.1 | 1% |
| 31 | −0.1 | −1% |
| 32 | −0.1 | 2% |
| 33 | −0.1 | −2% |
| 34 | −0.1 | 3% |
| 35 | −0.1 | −3% |
| 36 | 0.15 | 0% |
| 37 | 0.15 | 1% |
| 38 | 0.15 | −1% |
| 39 | 0.15 | 2% |
| 40 | 0.15 | −2% |
| 41 | 0.15 | 3% |
| 42 | 0.15 | −3% |

TABLE 1-continued

|    | Focus | Exposure amount |
|----|-------|-----------------|
| 43 | −0.15 | 0%              |
| 44 | −0.15 | 1%              |
| 45 | −0.15 | −1%             |
| 46 | −0.15 | 2%              |
| 47 | −0.15 | −2%             |
| 48 | −0.15 | 3%              |
| 49 | −0.15 | −3%             |

Process window analysis is performed for all of the subject patterns, whereby process parameter conditions with errors are extracted. Then by calculating the common process window of all of the subject patterns, process parameter conditions with even one error are extracted.

For each of the process parameter conditions, the occurrence probability thereof can be obtained. The variances of the various process parameters of the manufacturing device can be assumed as varying based on a normal distribution within the variability allowance values, and can be calculated from the occurrence probabilities of each of the various process parameters.

Table 2 shows calculations of the occurrence probabilities for each process parameter (49 conditions), assuming that the process parameters in Table 1 vary within a normal distribution (3s=variability allowance value). Also, the various process parameters variability for the exposure device is normally monitored at the time of manufacturing, and the occurrence probability can be obtained from the variability data thereof.

TABLE 2

| Focus | Dose frequency | −3%<br>0.6% | −2%<br>6.1% | −1%<br>24.2% | 0%<br>38.3% | 1%<br>24.2% | 2%<br>6.1% | 3%<br>0.6% |
|-------|----------------|-------------|-------------|--------------|-------------|-------------|------------|------------|
| −0.15 um | 0.621% | 0.0039% | 0.0376% | 0.1501% | 0.2378% | 0.1501% | 0.0376% | 0.0039% |
| −0.10 um | 6.1%   | 0.038%  | 0.367%  | 1.465%  | 2.320%  | 1.465%  | 0.367%  | 0.038%  |
| −0.05 um | 24.2%  | 0.15%   | 1.46%   | 5.84%   | 9.26%   | 5.84%   | 1.46%   | 0.15%   |
| 0.0 um   | 38.3%  | 0.24%   | 2.32%   | 9.26%   | 14.66%  | 9.26%   | 2.32%   | 0.24%   |
| 0.05 um  | 24.2%  | 0.15%   | 1.46%   | 5.84%   | 9.26%   | 5.84%   | 1.46%   | 0.15%   |
| 0.10 um  | 6.1%   | 0.038%  | 0.367%  | 1.465%  | 2.320%  | 1.465%  | 0.367%  | 0.038%  |
| 0.15 um  | 0.621% | 0.0039% | 0.0376% | 0.1501% | 0.2378% | 0.1501% | 0.0376% | 0.0039% |

Finally, the total sum is taken of the occurrence probabilities of the process parameter conditions which exhibit errors in the consolidated map, and computed as systematic yield decrease portions of the input layout (step S113).

Figure 2:
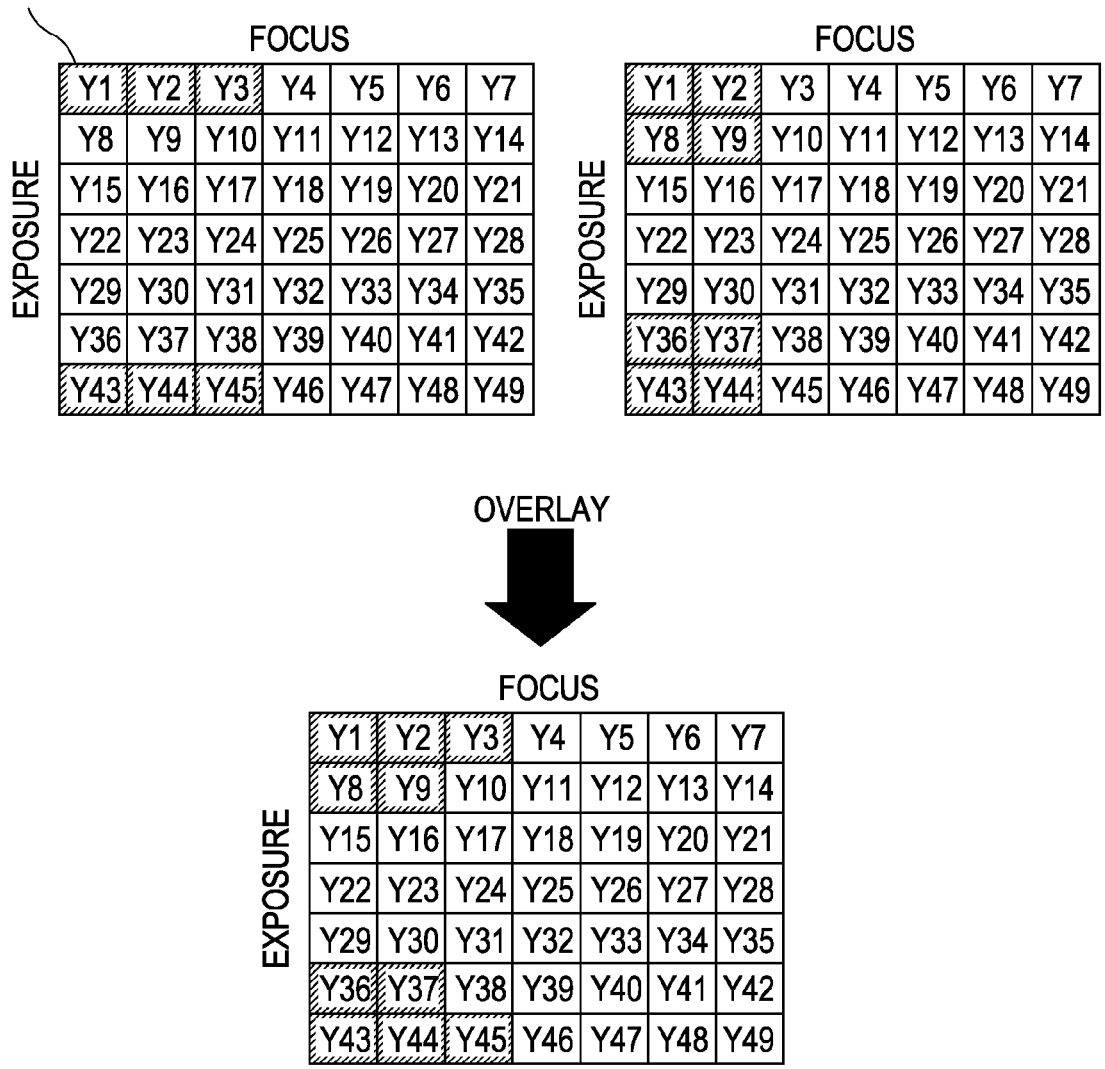
FIG. 2 is a schematic diagram illustrating a consolidated map of process windows.

FIG. 2 is a schematic diagram illustrating a common process window. In this example, two Hot Spot subject patterns (pattern 1 and pattern 2) schematically show the process window analysis results as to the input pattern layout.

In the diagram, Y1 through Y49 each represent a process window occurrence probability. Pattern 1 is not within the dimension allowance values with the process conditions corresponding to Y1, Y2, Y3, Y43, Y44, Y45, and pattern 2 is not within the dimension allowance values with the process conditions corresponding to Y1, Y2, Y8, Y9, y36, Y37, Y43, Y44 (see the shaded area in the diagram). Upon merging the results of pattern 1 and pattern 2, this becomes a common process window, whereby process conditions corresponding to Y1, Y2, Y3, Y8, Y9, Y36, Y37, Y43, Y44, Y45 become errors. The total sum=Y1+Y2+Y3+Y8+Y9+Y36+Y37+Y43+Y44+Y45 becomes the systematic yield loss of this layout.

Example of Open Wiring Defect

Next, as a specific example, the case of an open wiring defect will be described. In the case of considering an open wiring defect of a Cu wiring process with a minimum pattern of 120 nm, for example by varying the process parameters of the exposure device focus and exposure amount, an open wiring defect resulting from process variability of the lithography process can be simulated.

If we say that the variability allowance value of the exposure device focus and exposure amount is a focus of ±0.15 μm and dose of ±3%, as a process corner condition in the case of open wiring the focus is set to −0.15 μm and exposure amount of −3%, thereby performing the simulation. Also, the dimension allowance value of the Cu line width is set as 100 nm or greater.

Figure 3:
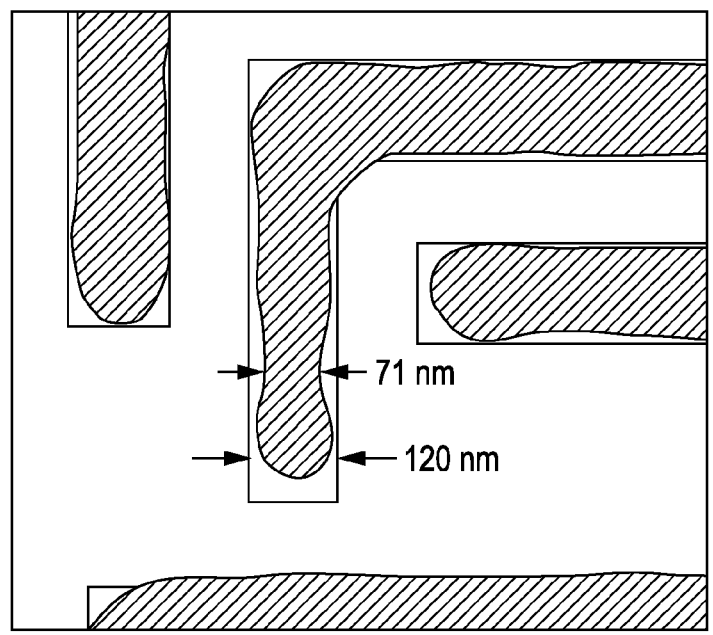
FIG. 3 is a schematic diagram illustrating a defect pattern for open wiring with a minimum pattern of 120 nm.

FIG. 3 illustrates an example of a defect pattern for open wiring with a minimum pattern of 120 nm. With this example, the dimension allowance value is 100 nm, and with the conditions that the focus is −0.15 μm and the exposure amount is −3%, the transfer shape is 71 nm, far lower than the dimension allowance value of 100 nm.

Table 3 shows results of performing process window analysis with the step width of the process parameters in Table 1 as to the open wiring defect in FIG. 3.

TABLE 3

| Dose/Focus | −3% | −2% | −1% | 0% | 1% | 2% | 3% |
|------------|-----|-----|-----|-----|-----|-----|-----|
| −0.15 um | 71 | 76 | 80 | 84 | 89 | 93 | 98 |
| −0.10 um | 93 | 96 | 99 | 103 | 107 | 110 | 113 |
| −0.05 um | 102 | 105 | 109 | 112 | 115 | 117 | 121 |
| 0.0 um   | 109 | 111 | 114 | 117 | 120 | 122 | 125 |
| 0.05 um  | 102 | 105 | 109 | 112 | 115 | 117 | 121 |
| 0.10 um  | 93 | 96 | 99 | 103 | 107 | 110 | 113 |
| 0.15 um  | 71 | 76 | 80 | 84 | 89 | 93 | 98 |

[nm]

If we say that there are 20 conditions of the combination between focus and exposure amount of less than the dimension allowance value 100 nm (see the shaded portions in Table 3), and the occurrence probabilities in Table 2 are employed, the total sum of the occurrence rates of the 20 conditions herein is 2.0%, whereby this becomes the systematic yield decrease of the open wiring defect in FIG. 2.

Figure 4:
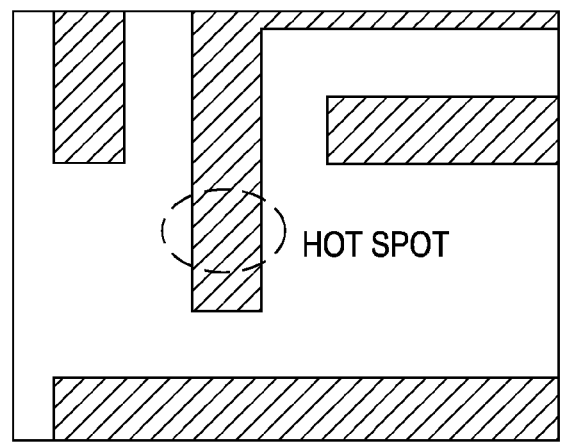
FIG. 4 is a schematic diagram illustrating an example of a pattern avoiding of a hot spot shape of a wiring opening.
Figure 4:
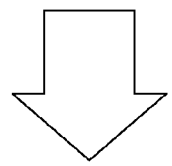
Figure 4:
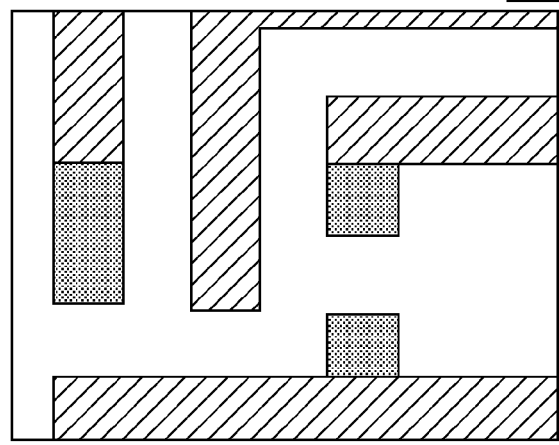

Now, a pattern to avoid the hot spot shape in the open wiring shown in FIG. 3 is illustrated in FIG. 4 employing a technique described in Japanese Unexamined Patent Application Publication No. 2006-154404. By providing an extension portion from an adjacent pattern, the Hot Spot is avoided. However, the space between the wiring becomes narrow, and the occurrence probability of wiring short defects due to defects such as a particle or the like has increased. Wiring short defects can be computed as yield with a method employing critical areas, and the random yield loss and the systematic yield gain from open wiring defects can be compared, whereby an optimal layout can be selected as the yield.

Example of Via Connection Defect and Device Management Specification Settings

Next, as a specific example, a via wiring defect and device management specification setting example will be described. In the case of considering a via connection defect from an alignment shift, a via connection defect resulting from process variability can be simulated by varying the process parameters of the exposure device focus and exposure amount and the alignment shift of the via in the via layer or in the via layer and connecting wiring layer.

Figure 5:
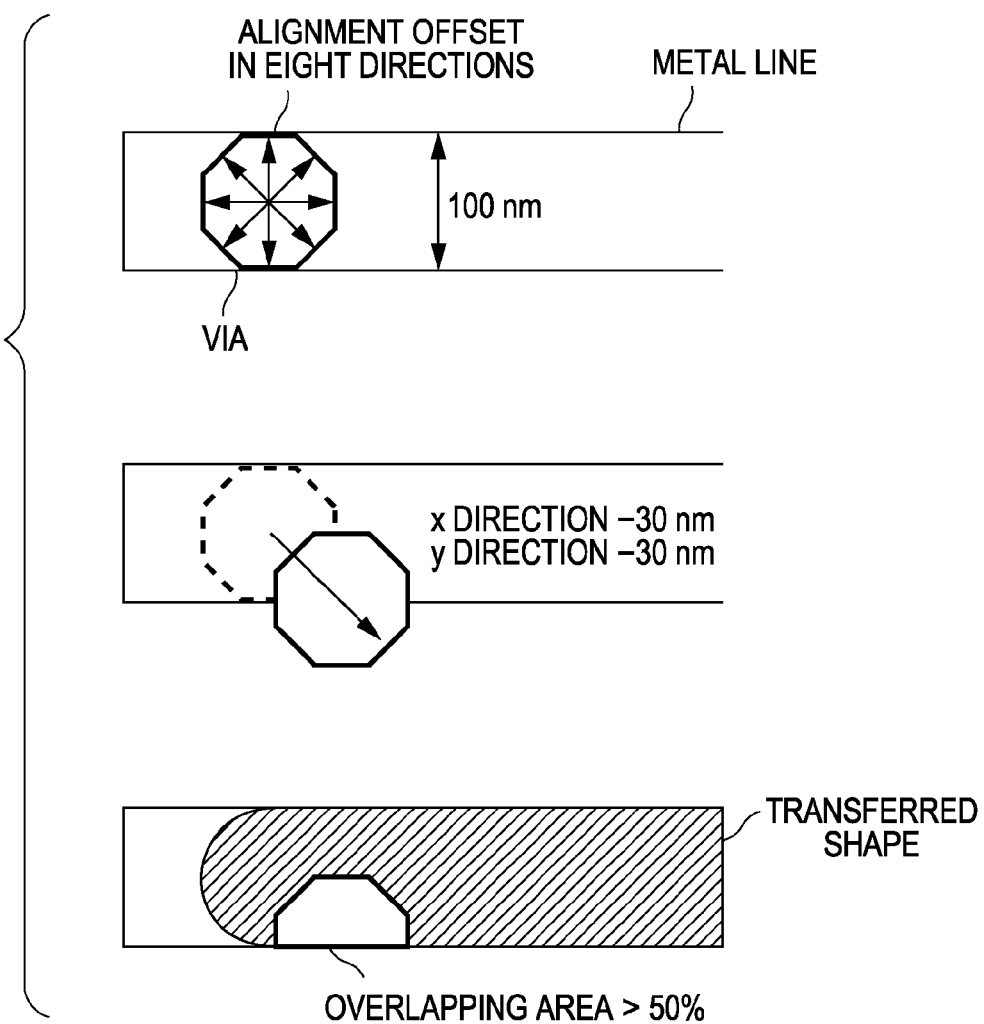
FIG. 5 is a schematic diagram illustrating an example of poor via connection.

FIG. 5 schematically illustrates the via connection defect which is set such that the via diameter is 100 nm, the alignment variability allowance value is ±30 nm (8 directions), and the dimension allowance value is set to 50% or more of the via coverage area of the wiring layer.

In the case that the results of simulation with the worst corner conditions is only a pattern within the dimension allowance values, relaxing the alignment specifications of the device management can be considered.

Figure 6:
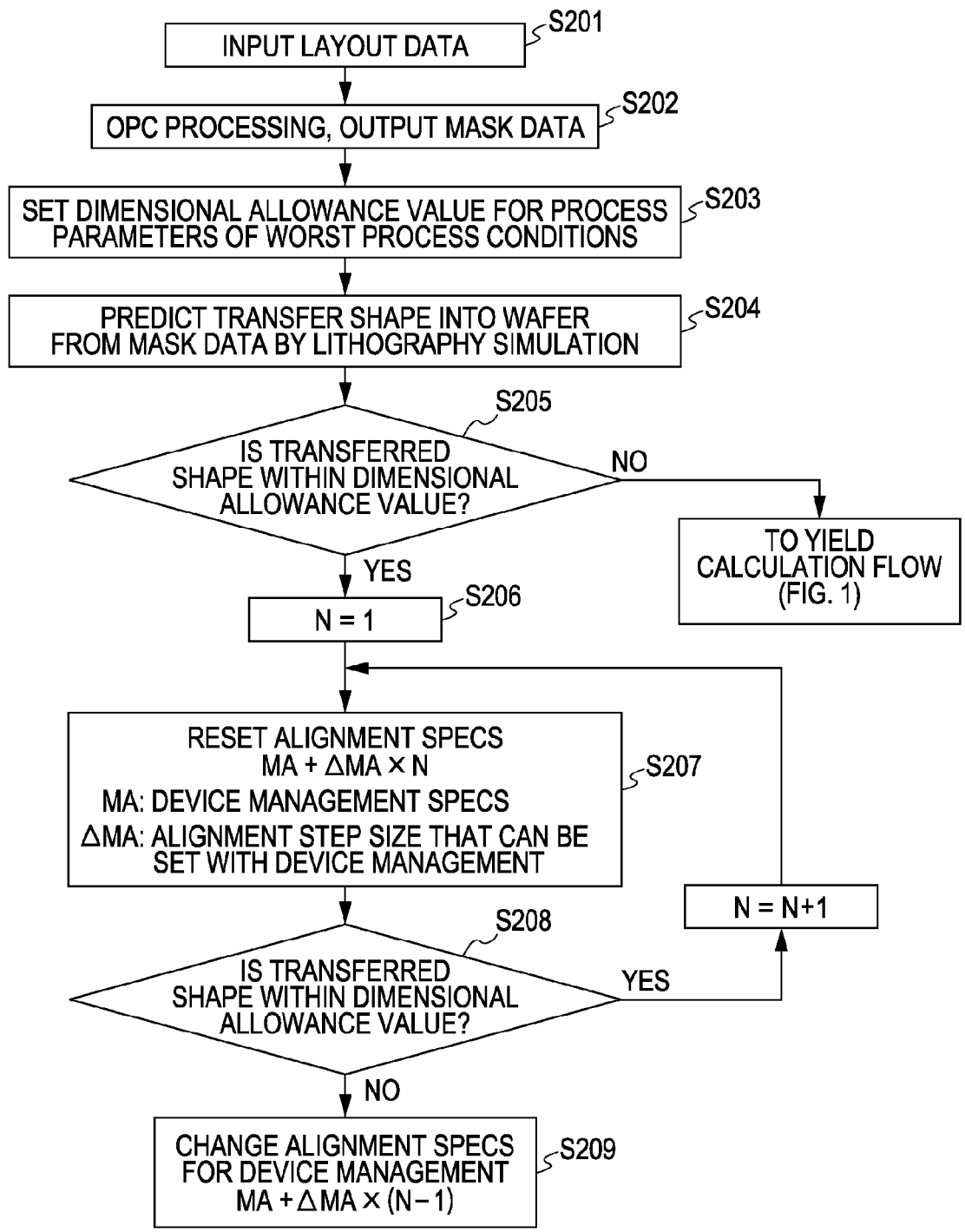
FIG. 6 is a flowchart describing the processing to obtain the amount of relaxing of the alignment specifications.

FIG. 6 shows a flowchart to obtain the amount of alignment specifications relaxed. First, the design layout data of a mask pattern is obtained from a database for example (step S201), and OPC processing is performed as to the layout data and a mask pattern is created (step S202).

Next, the created mask pattern is divided into multiple regions, the data from each region is input in a lithography simulation, and the transfer shape on the wafer is predicted (step S203 through S204). In this event, the dimension allowance values as to the transfer shape are set (step S203), and a pattern not within the dimension allowance values is extracted to become a region (subject pattern) to be subjected to process window analysis.

As a result of a lithography simulation with the process corner conditions for pattern extraction, in the case that the result is not within dimension allowance values (No in step S205), the flow is advanced to the yield computing flowchart shown in FIG. 1.

On the other hand, as a result of a lithography simulation with the process corner conditions for pattern extraction, in the case that the result is within dimension allowance values (Yes in step S205), a repeat number N is set to N=1 (step S206), the lithography simulation is repeated until a pattern not within the dimension allowance values occurs (N=1, 2, 3, . . . ) with the process parameters relaxed by a step width ($\Delta$MA) at a time of the alignment specifications which can be set as to an alignment specification (MA) according to the related art (steps S207 through S208). Thus, the value, wherein the alignment specification is maximum in a range where yield loss does not occur, can be provided with MA+$\Delta$MA×(N−1) (step S209), and can be disclosed as a numerical value to reset the device management specifications.

Also, in the case that there are patterns not within the dimension allowance values, allowances can be made if the calculated yield decrease is very small. In the case that a numerical value is set wherein the yield loss can be allowed (target yield), allowances can be made if the calculated yield loss is smaller than the target yield loss.

Figure 7:
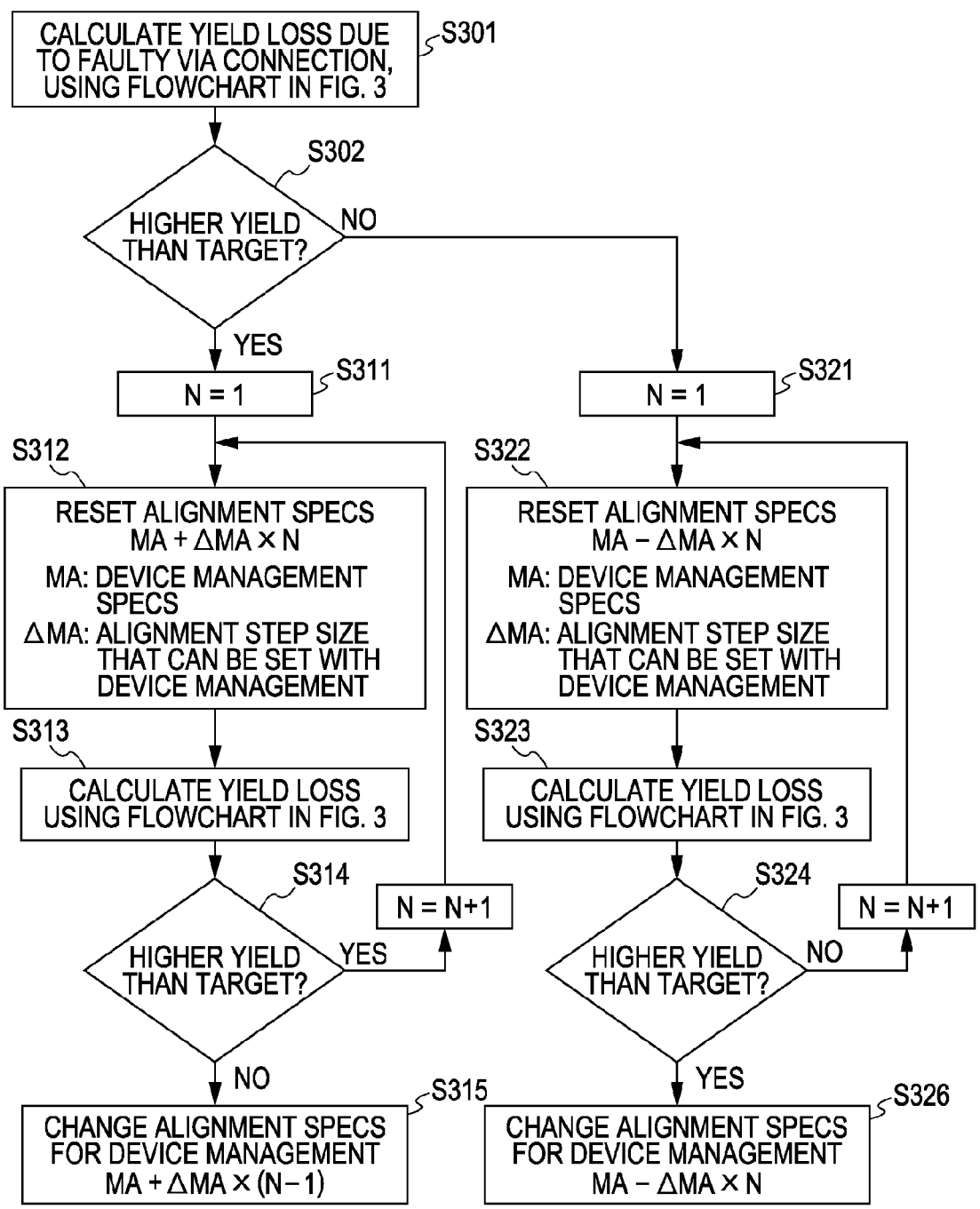
FIG. 7 is a flowchart describing the processing to obtain the amount of relaxing of the alignment specifications according to target yield.

FIG. 7 is a flowchart describing the processing to obtain the amount of relaxing of the alignment specifications according to target yield. First, the yield loss of a via connection defect is computed with the flowchart shown in FIG. 1 (step S301). Then the processing is divided based on whether the yield is higher than the target or not (step S302).

In the case that the yield herein is higher than that of the target (Yes in step S302), the repeat number N is set to N=1 (step S311), and is repeated until the systematic yield loss exceeds the target yield loss (N=1, 2, 3, . . . ) with the process parameters relaxed by a step width ($\Delta$MA) at a time of the alignment specifications which can be set as to an alignment specification (MA) according to the related art (steps S312 through S314). Thus, the value, wherein the alignment specification is maximum in a range where yield loss does not occur, can be provided with MA+$\Delta$MA×(N−1) (step S209), and can be disclosed as a numerical value to reset the device management specifications.

On the other hand, in the case that the yield loss is more than the target yield (No in step S302), an alignment specification for satisfying the target yield can be disclosed. That is to say, the repeat number N is set to N=1 (step S321), and is repeated until the systematic yield loss fulfils the target yield (N=1, 2, 3, . . . ) with the process parameters strictly set by a step width ($\Delta$MA) at a time of the alignment specifications which can be set as to an alignment specification (MA) according to the related art (steps S322 through S324). Thus, the value, wherein the alignment specification is maximum in a range where yield loss with consideration for manufacturing process variability does not occur, can be provided with MA−$\Delta$MA×N (step S325), and can be disclosed as a numerical value to reset the device management specifications.

According to the present embodiment, the following advantages can be obtained.

Random yield improvement portions from Via Doubling and systematic yield decrease portions from the increase in dense and isolated pattern can be compared, whereby the layout with the maximum yield can be selected.

The systematic yield improvement portion with Hot Spot reduction from the technique disclosed in Japanese Unexamined Patent Application Publication No. 2006-154404 and the random yield decrease portion from the critical area increase of the wiring shorting can be compared, whereby the layout with the maximum yield can be selected.

Information of the systematic yield resulting from variability of the assumed process can be provided to the manufacturing process side as feedback. Also, according to the chip layout, manufacturing management specifications can be set in a range having no yield loss from process variability, and manufacturing management specifications can be set without decreasing yield.

The maximum alignment specification relaxing amount can be disclosed within a range with no yield loss, or within a range with a computed systematic yield having a higher yield than the target yield.

In the case that the computed systematic yield is lower than the target yield, the alignment specifications for satisfying the target yield can be disclosed.

The mask pattern design method according to the above-described present embodiment can be applied as a semiconductor design program to execute various processes (the steps shown in the flowchart) with a computer (an electronic calculating device such as a personal computer or workstation). Thus, the mask pattern design method according to the present embodiment can be realized with processing with a computer. Also, the semiconductor design program employing the mask pattern design method according to the present embodiment may also be configured so as to be recorded onto a disk medium, or be distributed via a network, or have a portion of the steps thereof executed with a separate computer via a network.

Figure 8:
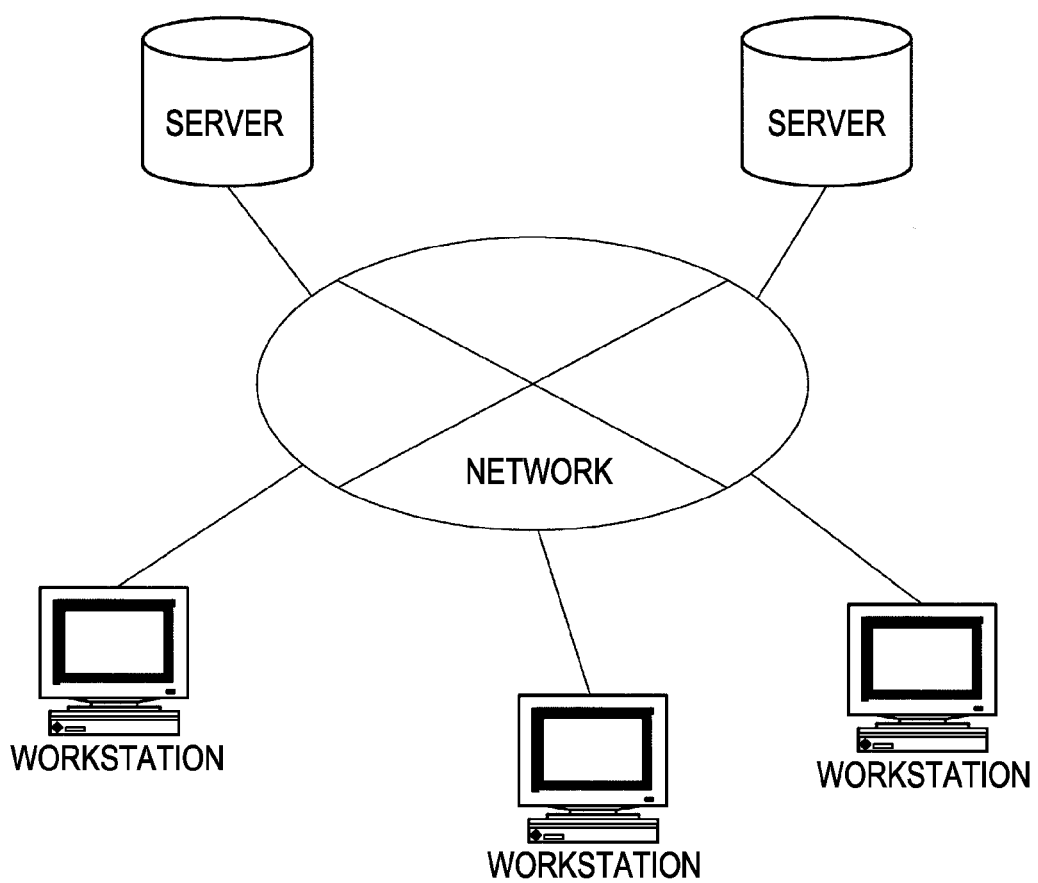
FIG. 8 is a schematic diagram illustrating an example of a system configuration.
Figure 9A:
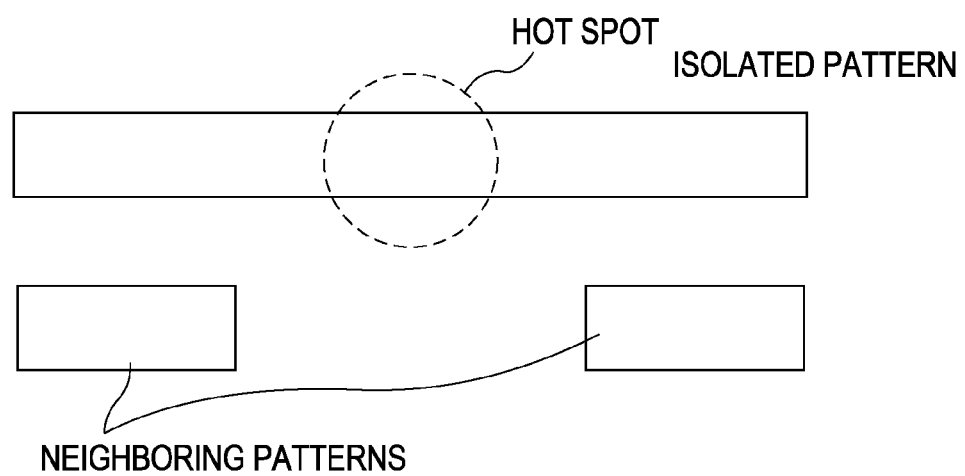
FIG. 9 is a schematic diagram illustrating an example of a pattern with minimal optical isolation.
Figure 9B:
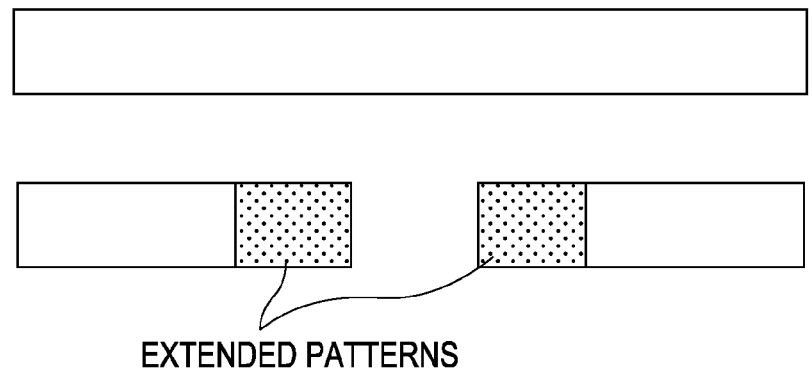
Figure 10A:
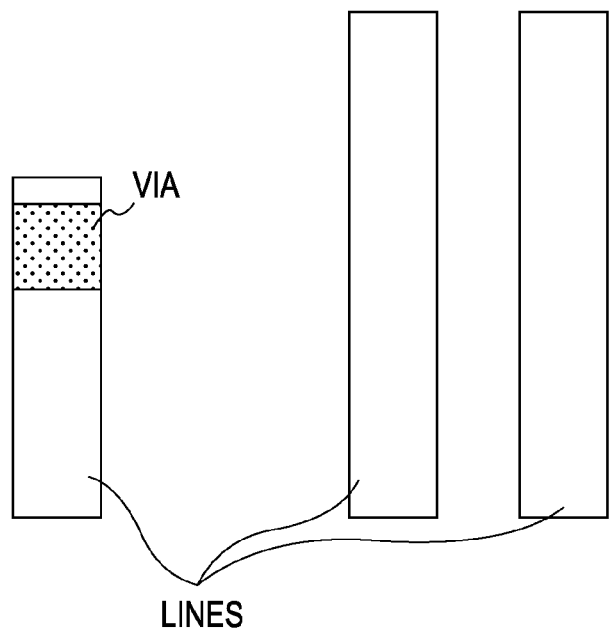
FIG. 10 is a schematic diagram illustrating an example of a pattern wherein a Hot Spot has occurred with Via Doubling function.
Figure 10B:
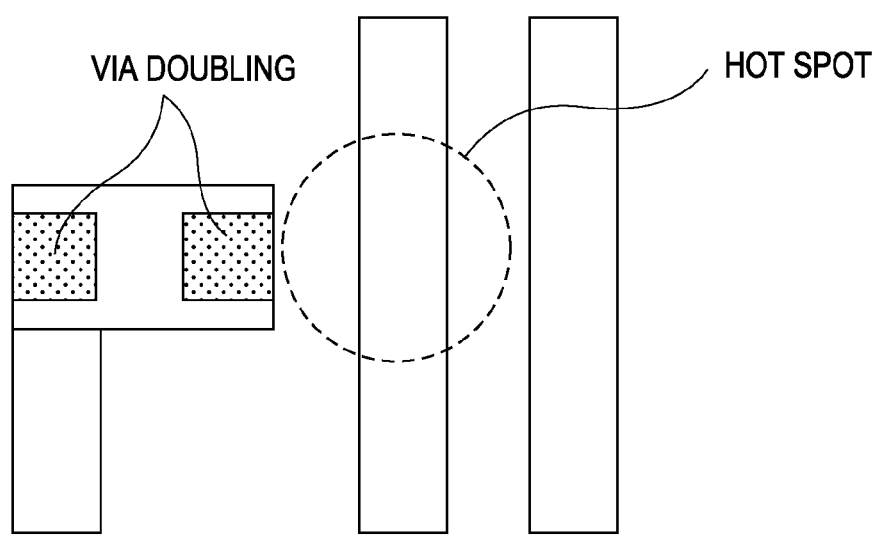

FIG. 8 is a schematic diagram illustrating an example of a system configuration to execute the semiconductor design program according to the present embodiment. That is to say, a design program tool such as a wiring simulator or transfer simulator or the like is installed in a workstation with a configured such that the workstation and server are connected via a network. The semiconductor design program according to the present embodiment may be built in to a portion of such design program tools, or may be installed as an independent program tool.

Data such a pattern layouts or the like of various types of masks are accumulated in a server. Accordingly, in order to use the semiconductor design program according to the present embodiment, mask pattern data is read into the workstation from the database via the network, and the above-described computations are performed.

Also, in the case that the semiconductor design program according to the present embodiment is configured with multiple modules, all of the modules may be installed in one workstation, but a configuration may also be made wherein various modules are dispersed and disposed in other workstations or servers, whereby these modules are called up via the network to be executed.

Manufacturing semiconductor devices employing a mask designed with such a semiconductor design program enables efficient production with accurate yield. It should be understood by those skilled in the art that various modifications, combinations, sub-combinations and alterations may occur depending on design requirements and other factors insofar as they are within the scope of the appended claims or the equivalents thereof.

What is claimed is:

1. A mask pattern design method, executed on an electronic processor, comprising the steps of:

dividing, via the electronic processor, design layout data for patterns into a plurality of regions and extracting regions in which transfer dimensions obtained from a transfer simulation of pattern data exceed a predetermined allowance range;

extracting, via the electronic processor, patterns that have the regions in which transfer dimensions obtained from the transfer simulation of said pattern data exceed the predetermined allowance range, and acquiring coordinates of the extracted patterns and difference amounts from the predetermined allowance range;

performing, via the electronic processor, process window analysis based on simulation regions in which the coordinates of the extracted patterns are centered in the simulation regions, respectively, the process window analysis including a plurality of transfer conditions that are respectively applied, and computing transfer dimensions obtained from a transfer simulation with respect to each of the plurality of transfer conditions;

extracting, via the electronic processor, process windows based on at least one transfer condition from the plurality of transfer conditions in which a transfer dimension obtained from the transfer simulation exceeds a predetermined allowance range;

computing yield loss, via the electronic processor, from an occurrence probability regarding the transfer condition in relation to the extracted process windows of the extracted patterns;

comparing, via the electronic processor, the yield loss to a target value; and determining, via the electronic processor, device alignment specifications based on said comparison, wherein, when the extracted patterns exceed a predetermined number of patterns and prior to performing the process window analysis, then the method includes selecting a predetermined number of extracted patterns with extracted regions having the greatest difference amounts from the predetermined allowance range as the extracted patterns in which the process window analysis is to be performed.

2. The mask pattern design method according to claim 1, wherein, when more than one region of the plurality of regions has transfer dimensions that exceed the predetermined allowance range, said method includes:

performing a transfer simulation with various transfer conditions for each region, extracting transfer conditions corresponding to transfer dimensions for each region having transfer dimensions that exceed the allowance range, and summing the occurrence probability for the transfer conditions for each process window corresponding to each extracted region, and computing the yield loss.

3. The mask pattern design method according to claim 1, further comprising:

comparing the transfer dimensions associated with the transfer simulation performed with the worst conditions of the variability allowance range of a manufacturing process assumed with the pattern transfer device with said predetermined allowance range.

4. A semiconductor manufacturing method comprising:

dividing design layout data for patterns into a plurality of regions and extracting regions in which transfer dimensions obtained from a transfer simulation of pattern data exceed a predetermined allowance range;

extracting, via the electronic processor, patterns that have the regions in which transfer dimensions obtained from the transfer simulation of said pattern data exceed the predetermined allowance range, and acquiring coordinates of the extracted patterns and difference amounts from the predetermined allowance range;

performing processing window analysis based on simulation regions in which the coordinates of the extracted patterns are centered in the simulation regions, respectively, the process window analysis including a plurality of transfer conditions that are respectively applied, and computing transfer dimensions obtained from a transfer simulation with respect to each of the plurality of transfer conditions;

extracting process windows based on at least one transfer condition from the plurality of transfer conditions in which a transfer dimension obtained from the transfer simulation exceeds a predetermined allowance range;

computing yield loss from an occurrence probability regarding the transfer condition in relation to the extracted process windows of the extracted patterns;

comparing the yield loss to a target value;

determining device alignment specifications based on said comparison; and performing pattern transfer with said design layout data based on said comparison, whereby a semiconductor device is manufactured, wherein, when the extracted patterns exceed a predetermined number of patterns and prior to performing the process window analysis, then the method includes selecting a predetermined number of extracted patterns with extracted regions having the greatest difference amounts from the predetermined allowance range as the extracted patterns in which the process window analysis is to be performed.

5. A non-transitory computer readable storage medium having a semiconductor design program to be executed by a computer, comprising the steps of:

dividing design layout data for patterns into a plurality of regions and extracting regions in which transfer dimensions obtained from a transfer simulation of pattern data exceed a predetermined allowance range;

extracting, via the electronic processor, patterns that have the regions in which transfer dimensions obtained from the transfer simulation of said pattern data exceed a predetermined allowance range, and acquiring coordinates of the extracted patterns and difference amounts from the predetermined allowance range;

performing processing window analysis based on simulation regions in which the coordinates of the extracted patterns are centered in the simulation regions, respectively, the process window analysis including a plurality of transfer conditions that are respectively applied, and computing transfer dimensions obtained from a transfer simulation for the extracted regions with respect to each of the plurality of transfer conditions;

extracting process windows based on at least one transfer condition from the plurality of transfer conditions in which a transfer dimension obtained from the transfer simulation exceeds the predetermined allowance range;

computing yield loss from an occurrence probability regarding the transfer condition in relation to the extracted process windows of the extracted patterns;

comparing the yield loss to a target value; and determining device alignment specifications based on said comparison, wherein, when the extracted patterns exceed a predetermined number of patterns and prior to performing the process window analysis, then the method includes selecting a predetermined number of extracted patterns with extracted regions having the greatest difference amounts from the predetermined allowance range as the extracted patterns in which the process window analysis is to be performed.

* * * * *